US010042007B2

(12) United States Patent
Heber

(10) Patent No.: US 10,042,007 B2
(45) Date of Patent: Aug. 7, 2018

(54) METHOD FOR DETECTING A FAILING RECTIFIER OR RECTIFIER SOURCE

(71) Applicant: Liebert Corporation, Columbus, OH (US)

(72) Inventor: Brian P. Heber, Delaware, OH (US)

(73) Assignee: Liebert Corporation, Columbus, OH (US)

(*) Notice: Subject to any disclaimer, the term of this patent is extended or adjusted under 35 U.S.C. 154(b) by 183 days.

(21) Appl. No.: 15/014,275

(22) Filed: Feb. 3, 2016

(65) Prior Publication Data

US 2016/0223620 A1 Aug. 4, 2016

Related U.S. Application Data

(60) Provisional application No. 62/111,864, filed on Feb. 4, 2015.

(51) Int. Cl.
*G01R 31/40* (2014.01)
*H02M 3/04* (2006.01)
(Continued)

(52) U.S. Cl.
CPC .............. *G01R 31/40* (2013.01); *H02J 9/062* (2013.01); *H02M 3/04* (2013.01); *H02M 7/219* (2013.01);
(Continued)

(58) Field of Classification Search
CPC .... G01R 31/00; G01R 31/40; H01H 2300/00; H01H 2300/018; H02J 2009/00;
(Continued)

(56) References Cited

U.S. PATENT DOCUMENTS 6,445,089 B1 9/2002 Okui
6,556,459 B2 4/2003 Okui et al.
(Continued)

OTHER PUBLICATIONS

Zheng, Zheng, Zhou, Wenbin, He, Hui; "Research on the Novel Charge-discharge System of Storage Battery", Journal of Computers, vol. 8, No. 2, Feb. 2013.
(Continued)

*Primary Examiner* — Lincoln Donovan
*Assistant Examiner* — David Mattison
(74) *Attorney, Agent, or Firm* — Harness, Dickey & Pierce, P.L.C.

(57) ABSTRACT

A method is provided for detecting a failure of a rectifier or a rectifier source in context of an uninterruptible power supply. The method includes: measuring an input current into the rectifier from a primary power source; determining a rate of change in the measured current; determining a current difference between a reference current and the measured current; measuring voltage output by the rectifier; determining a voltage difference between a reference voltage and the measured voltage; and detecting a failure condition of the rectifier as a function of the measured input current, the rate of change in the measured current, the current difference, the measured voltage and the voltage difference. More specifically, a failure condition of the rectifier is identified when the input current is decreasing and the rate of change in the measured current is decreasing and the current difference is increasing and the voltage difference is increasing.

14 Claims, 6 Drawing Sheets

(51) Int. Cl.

| | |
|---|---|
| ***H02M 7/44*** | (2006.01) |
| ***H02M 7/219*** | (2006.01) |
| ***H02J 9/06*** | (2006.01) |
| *H02M 5/458* | (2006.01) |

(52) U.S. Cl.
CPC ......... *H02M 7/44* (2013.01); *H02J 2009/068* (2013.01); *H02M 5/4585* (2013.01)

(58) Field of Classification Search
CPC .......... H02J 2009/068; H02J 9/00; H02J 9/06; H02J 9/061; H02J 9/062; H02J 9/08; H02M 3/00; H02M 3/04; H02M 5/00; H02M 5/4585; H02M 7/00; H02M 7/219; H02M 7/44
USPC ............................................................ 307/64
See application file for complete search history.

(56) References Cited

U.S. PATENT DOCUMENTS

| | | | | |
|---|---|---|---|---|
| 6,753,622 | B2 | 6/2004 | Oughton, Jr. | |
| 6,757,185 | B2 | 6/2004 | Rojas Romero | |
| 6,917,124 | B2 | 7/2005 | Shetler, Jr. et al. | |
| 7,352,083 | B2 | 4/2008 | Nielsen et al. | |
| 7,403,364 | B2 | 7/2008 | Anderson et al. | |
| 7,505,293 | B2 | 3/2009 | Baudesson et al. | |
| 7,579,714 | B2 | 8/2009 | Okui | |
| 7,864,552 | B2 | 1/2011 | Heber et al. | |
| 7,881,079 | B2 | 2/2011 | Prasad et al. | |
| 8,437,158 | B2 | 5/2013 | Fattal | |
| 2012/0181871 | A1* | 7/2012 | Johansen | H02J 9/062 307/66 |
| 2012/0306274 | A1 | 12/2012 | Shetler, Jr. et al. | |
| 2013/0015704 | A1 | 1/2013 | Tsai et al. | |
| 2014/0008977 | A1 | 1/2014 | Koukkari et al. | |
| 2014/0167809 | A1* | 6/2014 | Sebald | G01R 31/42 324/764.01 |

OTHER PUBLICATIONS

International Search Report and Written Opinion for PCT/US2016/016524, dated Jun. 29, 2016.

* cited by examiner

METHOD FOR DETECTING A FAILING RECTIFIER OR RECTIFIER SOURCE

CROSS-REFERENCE TO RELATED APPLICATIONS

This application claims the benefit of U.S. Provisional Application No. 62/111,864 filed on Feb. 4, 2015. The entire disclosure of the above application is incorporated herein by reference.

FIELD

The present disclosure relates to method for detecting a failing rectifier or rectifier source, for example in an uninterruptible power supply system.

BACKGROUND

In uninterruptible power supply systems, a DC/DC converter is typically disposed between the DC bus and a secondary power source, such as a battery. Upon detecting a failure in the primary power source, the DC/DC converter switches from supplying power to the battery over to supplying power to the inverter. Conventional techniques for detecting a failure in the primary power source involve measuring the source voltage. Such techniques may falsely detect a failure during the occurrence of a surge or sag in the source voltage. Additionally, relying solely on the source voltage will not detect a failure of the rectifier.

Therefore, it is desirable to develop an improved technique for detecting a failing rectifier or rectifier source. This section provides background information related to the present disclosure which is not necessarily prior art.

SUMMARY

This section provides a general summary of the disclosure, and is not a comprehensive disclosure of its full scope or all of its features.

A method is provided for detecting a failure of a rectifier or a rectifier source in context of an uninterruptible power supply. The method includes: measuring an input current into the rectifier from a primary power source; determining a rate of change in the measured current; determining a current difference between a reference current and the measured current; measuring voltage output by the rectifier; determining a voltage difference between a reference voltage and the measured voltage; and detecting a failure condition of the rectifier as a function of the measured input current, the rate of change in the measured current, the current difference, the measured voltage and the voltage difference. More specifically, a failure condition of the rectifier is identified when the input current is decreasing and the rate of change in the measured current is decreasing and the current difference is increasing and the voltage difference is increasing.

In response to identifying a failure condition, power supplied to the inverter is switch from the primary power source to the secondary power source. In some embodiments, the switch to the secondary power supply may be delayed for a period of time.

In one aspect, input current and output voltage are measured in the D phase of a rotating reference frame.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

DETAILED DESCRIPTION

Example embodiments will now be described more fully with reference to the accompanying drawings.

Figure 1:
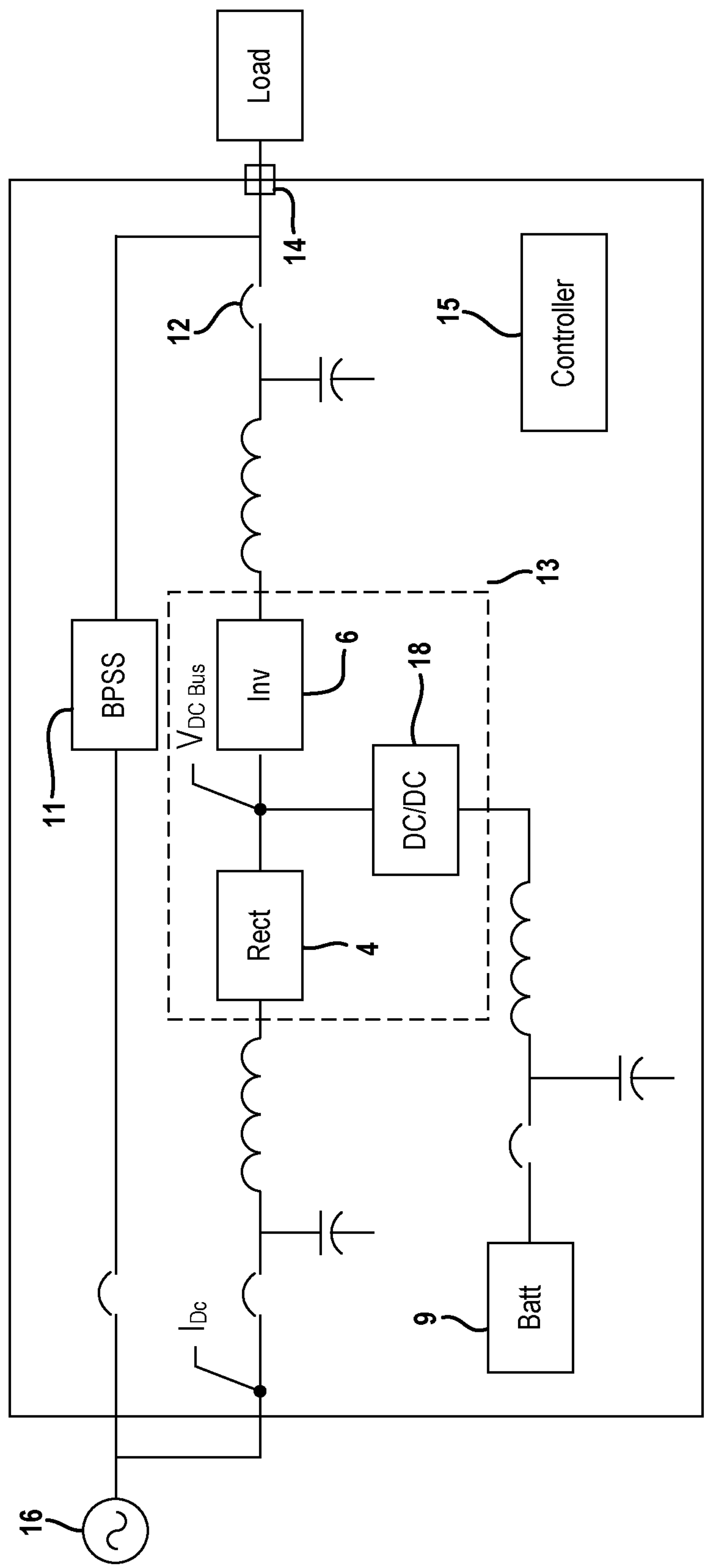
FIG. 1 is a block diagram depicting a typical uninterruptible power supply (UPS)

FIG. 1 is a simplified schematic of a typical uninterruptible power supply 10. An uninterruptible power supply (UPS) 10 is typically used to protect computers, data centers, telecommunications equipment or other electrical equipment. The UPS 110 generally includes a bypass switch 11, a UPS switch 12, a UPS converter 13, an output terminal 14 and a controller 15. In the example embodiment, the bypass switch 11 is coupled between the primary power source 16 and the output terminal 14 and configured to receive an AC input signal from the primary power source 16. In a similar manner, the UPS converter 13 is coupled between the primary power source 16 and the output terminal 14 and configured to receive an AC signal from the primary power source 16. The UPS switch 12 is interposed between an output of the UPS converter 13 and the output terminal 14.

The UPS converter 13 further includes a rectifier 4, an inverter 6, a DC/DC converter 18 and a secondary power source 9, such as battery. The rectifier 4 converts the AC input from an AC signal to a DC signal; whereas, the inverter 6 converts a DC signal to an AC signal. The DC/DC converter 18 interfaces the battery 9 to the main DC bus. The inverter 6 is configured to receive an input signal from either the rectifier 4 or the battery 9. In normal operation, the rectifier 4 supplies the DC signal to the inverter 6 and the DC/DC converter 18 provides a charging current for the battery 9. If the primary power source 16 is not available or the rectifier cannot otherwise provide enough power, the DC/DC converter switches from a charging mode to a discharging mode and the battery 9 supplies the input signal to the inverter 6. Such converter arrangements are known in the art.

The controller 15 monitors the operating conditions of the UPS 10 and controls the bypass switch 11 and the UPS switch 12 depending on the selected mode of operation and the operating conditions. In an exemplary embodiment, the controller 15 is implemented as a microcontroller. In other embodiments, controller may implemented in a field programmable gate array, a complex programmable logic device, analog circuitry or other suitable components that provide the described functionality; or a combination of some or all of the above.

Figure 2:
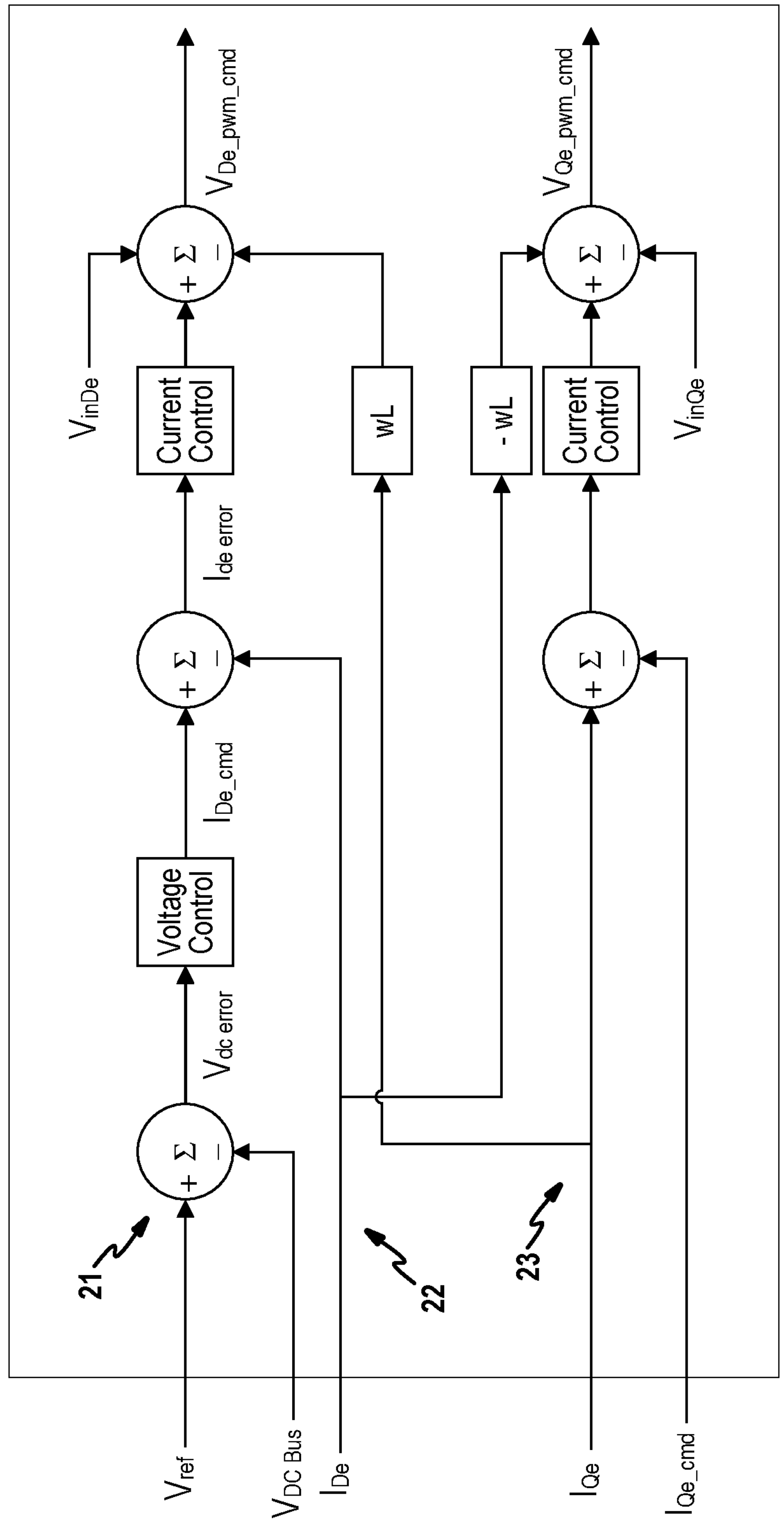
FIG. 2 is a diagram for a typical control scheme for a UPS.

FIG. 2 depicts a typical control scheme for the rectifier of the UPS. In this example, the control scheme is implemented in the direct quadrature rotating reference frame. The control scheme is comprised generally of an outer voltage loop 21 and two inner current loops: one for the D axis 22 and one for the Q axis 23. The outer voltage loop 21 operates in the D axis and regulates the power supplied by the rectifier to the main DC bus. The inner current loops provide fast transient response and power factor control. While reference is made throughout this disclosure to a DQ reference frame, it is envisioned that the concepts described herein are applicable to other types of rotational reference frames as well as stationary reference frames.

When in a normal operating mode, the voltage error ($V_{dc\ error}$) and the current error ($I_{de\ error}$) in the control loops are very small. When there is a change in the load or a change in the source voltage, these error signals will increase or decrease accordingly. Likewise, when there is a problem with the rectifier, these error signals will change as well. Table 1 below shows the changes to various control signals for different types of disturbances.

| Disturbance Type | Input Current ($I_{De}$) | Input Current Rate of Change ($I_{De}$) | ($V_{dc\ error}$) | ($I_{de\ error}$) |
|---|---|---|---|---|
| Load Applied | Increase | Increase | Increase | Decrease |
| Load Removed | Decrease | Decrease | Decrease | Increase |
| Rectifier Fail | Decrease | Decrease | Increase | Increase |
| Input Source Fail | Decrease | Decrease | Increase | Increase |
| Input Source Sag (10%) | Small Increase | Very Small Increase | Small Increase | Small Increase |
| Input Source Surge (10%) | Small Decrease | Very Small Decrease | Small Decrease | Small Decrease |

If the input current ($I_{DE}$) is greater than threshold one and the rate of change of the input current ($\Delta I_{DE}$) is greater than zero, then the load is increasing and so the increase in voltage error is expected. Conversely, if the input current is not greater than threshold one and the rate of change of the input current is not greater than zero, then the load is decreasing and so the increase in current error is expected. For load changes, it is noted that the voltage error and the current error change in opposite directions. The input current ($I_{DE}$) and the rate of change of the input current ($\Delta I_{DE}$) change in the same direction as the voltage error.

Figure 6:
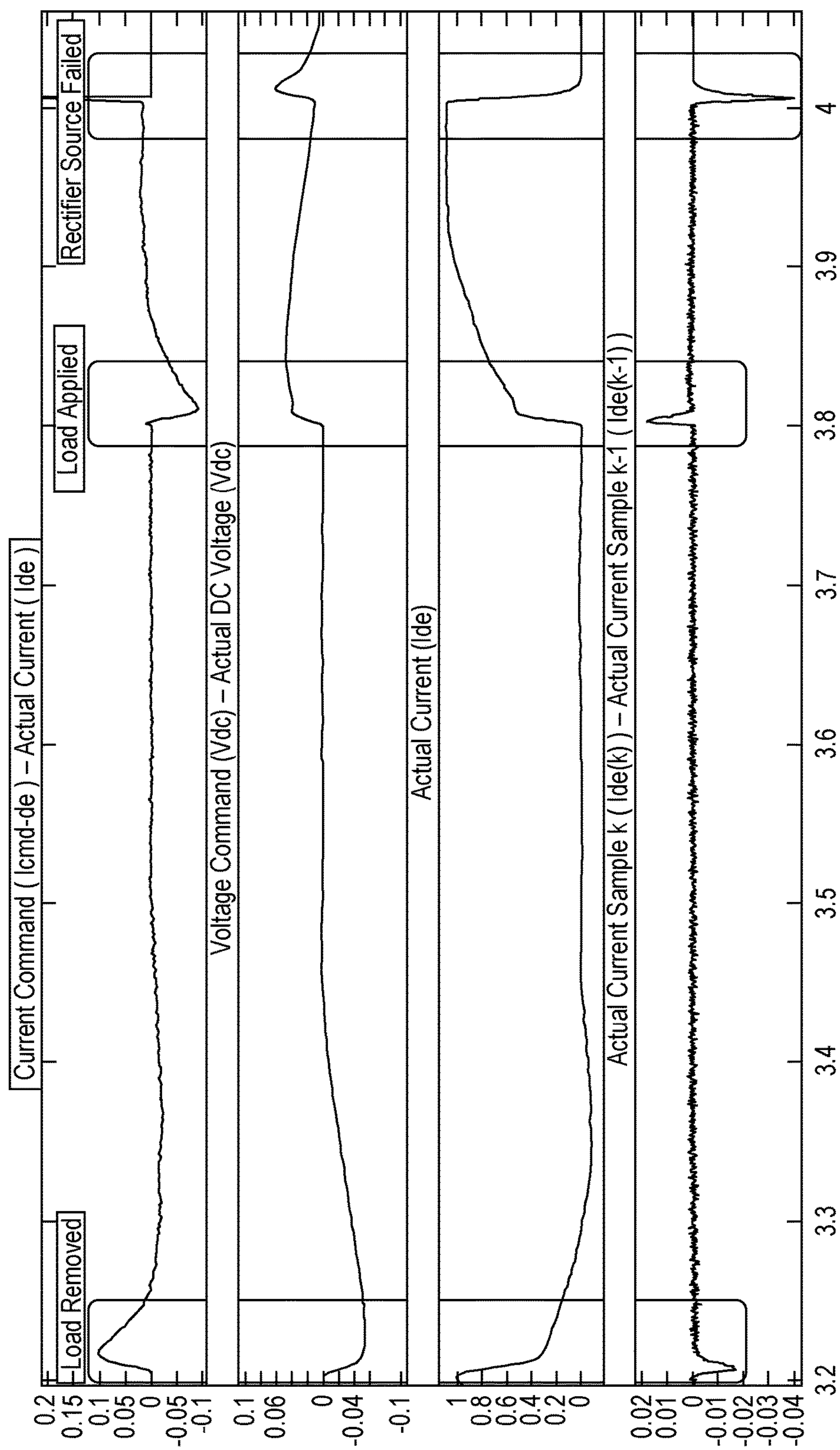
FIG. 6 are simulation results of control signals for various disturbances Corresponding reference numerals indicate corresponding parts throughout the several views of the drawings.

More importantly, when the rectifier fails or the input source to the rectifier fails (i.e., primary power source), the input current and the rate of change of the input current are always increasing while the voltage error and the current error are always decreasing. In fact, the rate of decrease or increase is much greater than when the load changes. This observation can be used to detect the occurrence of a failing rectifier or rectifier source. Simulation results of the control signals for different disturbances are illustrated in FIG. 6

Figure 3:
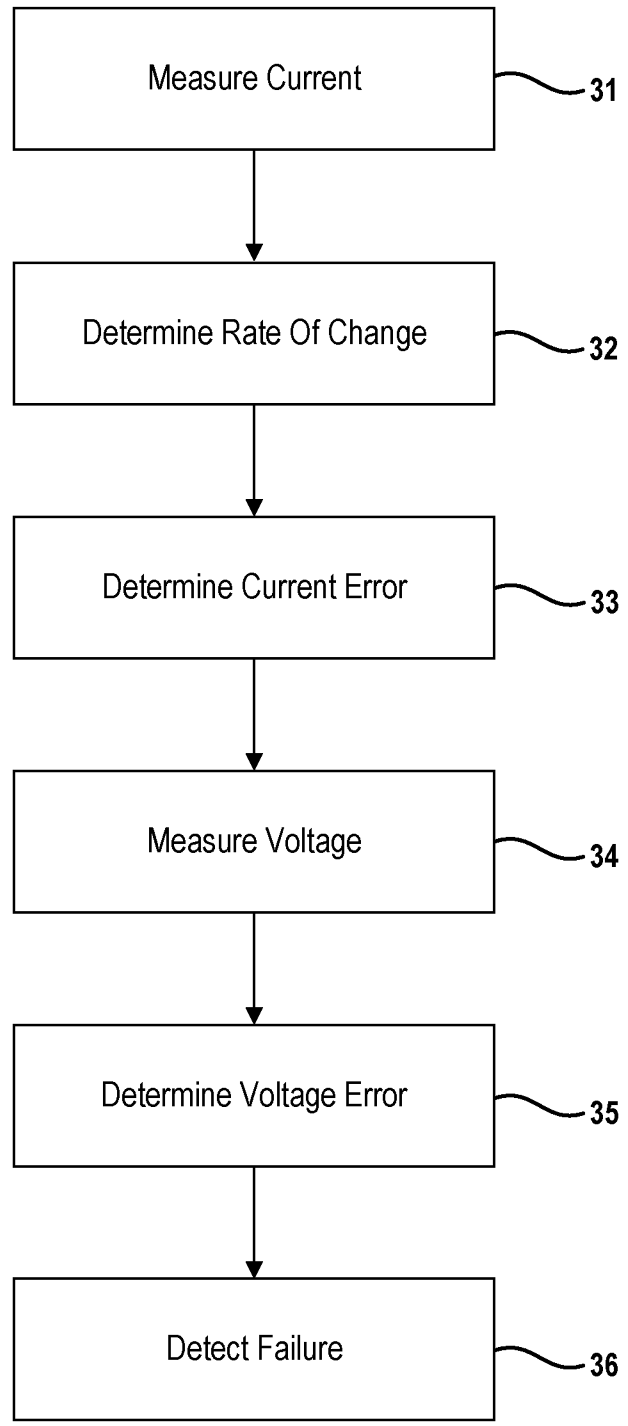
FIG. 3 is a flowchart illustrating a method for detecting a failure condition of the rectifier.

An improved technique for detecting a failing rectifier or rectifier source is further described in relation to FIG. 3. Various control signals are measured and computed during operation of an UPS. For example, the input current into the rectifier from the primary power source is measured at 31. From the measured input current, the rate of change in the measured current can be computed at 32, for example by subtracting consecutive measures. Additionally, the current error can be computed at 33 by taking a difference between a reference current and the measured current, where the reference current may be defined as the desired D phase current.

Voltage output by the rectifier is also measured at 34. From the measured voltage, the voltage error can be computed at 35 by taking the difference between a reference voltage and the measured voltage, where the reference voltage is a target out voltage which may be set by a user. Different techniques for measuring voltage or current fall within the scope of this disclosure.

A failing condition of the rectifier or the rectifier source is then detected at 36 as a function of the measured current, the rate of change in the measured current, the current difference, the measured voltage and the voltage difference. In one embodiment, the measure current and the rate of change in the measure current can be used to determine the occurrence or absence of a change in the load serviced by the rectifier. In the absence of a load change, a failing condition is identified when the current difference and the voltage difference are both increasing. In other embodiments, a failing condition can be identified when the input current is decreasing, the rate of change in the measured current is decreasing, the current difference is increasing and the voltage difference is increasing. In response to identifying a failure condition, the controller will take corrective actions. In the context of a UPS, power supplied to the inverter is switched from the primary power source to the secondary power source.

Figure 4:
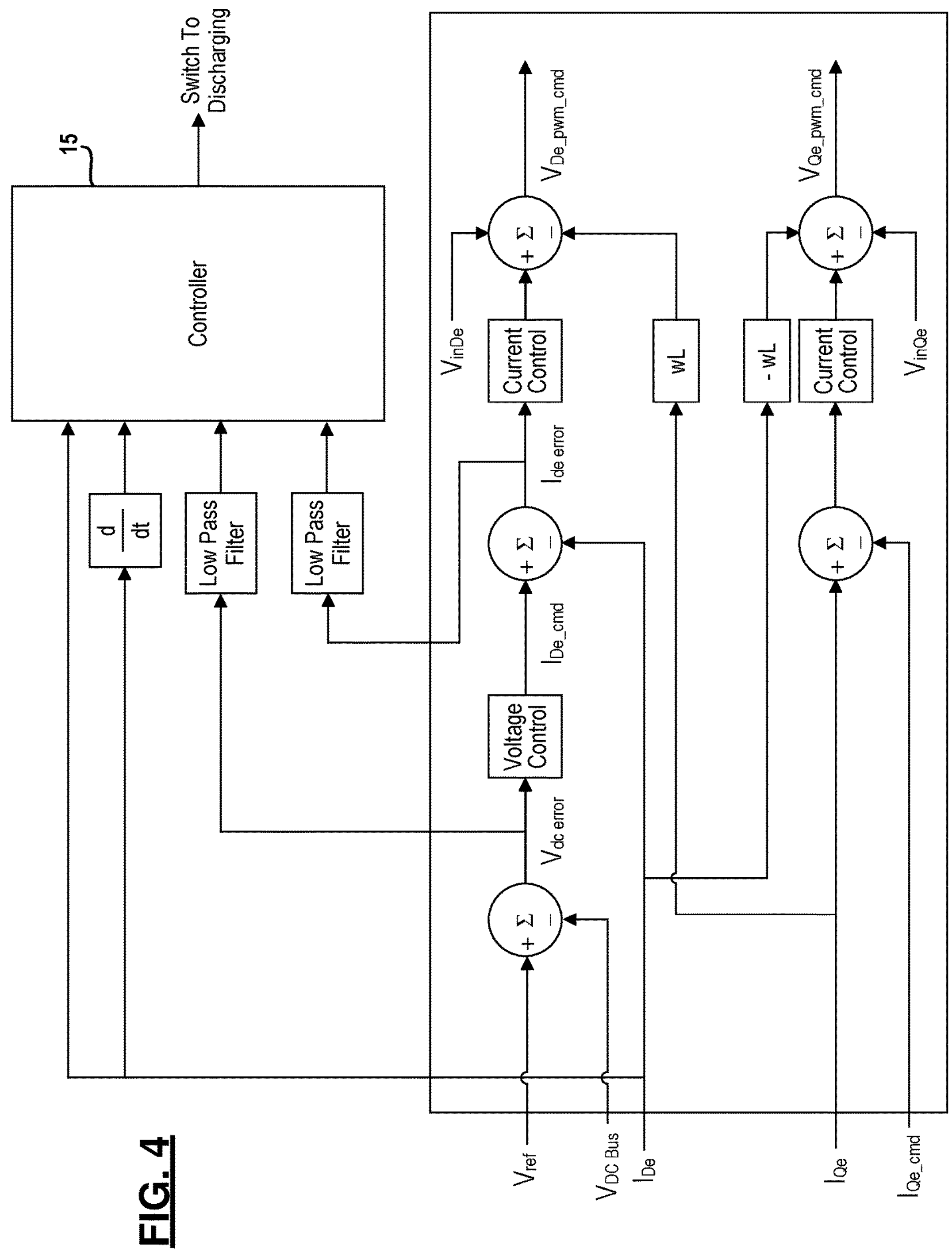
FIG. 4 is a diagram for a control scheme which implements rectifier failure detection logic.

FIG. 4 depicts a control scheme for the rectifier which implements rectifier failure detection logic. For the most part, the control scheme implements the three control loops described above in relation to FIG. 2. The controller 15 of the UPS is configured to receive control signals. In particular, the controller receives the measured current, the current error and the voltage error. One or more of these signals may pass through a low pass filter before reaching the controller 15. Filtering removes noise from the control signals and provides signal stability before the decision process. The controller 15 also receives the derivative or rate of change of the measured current as well.

Figure 5:
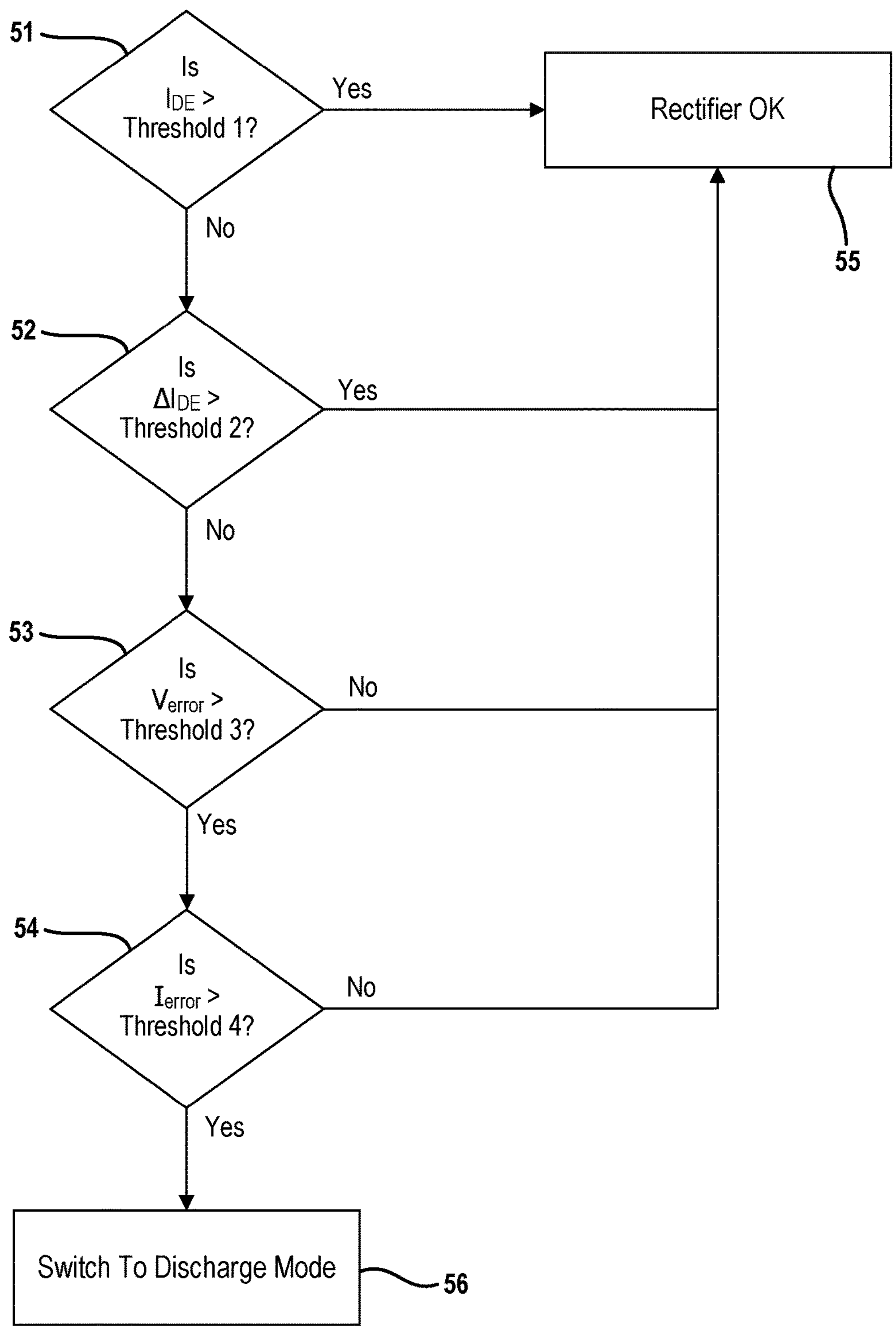
FIG. 5 is a flowchart depicting an example embodiment of the rectifier failure detection logic.

FIG. 5 sets forth an example embodiment of the rectifier failure detection logic. First, the measured input current and the rate of change of the measured current are compared to thresholds one and two, respectively, as indicated at 51 and 52. The load is deemed to be changing when one or both of these metrics are above respective thresholds and thus the rectifier and the rectifier source are deemed to be functioning properly. If either of these metrics are decreasing or below the respective thresholds, the load is not changing and further inquiries are made. Next, the voltage error and the current error are compared at 53 and 54 to thresholds three and four, respectively. If the voltage error and the current are both above respective thresholds, then rectifier or the rectifier source is deemed faulty as indicated at 56; otherwise, the rectifier and the rectifier source are deemed to be functioning properly as indicated at 55.

In a normal mode, power is supplied from the primary power source via the rectifier to the inverter. Additionally, the DC/DC converter provides a charging signal to the secondary power source (e.g., battery). In discharge mode, power is supplied from the secondary power source via the DC/DC converter to the inverter. When a failure condition is detected at 56, the DC/DC converter is immediately changed from charge mode to the discharge mode so that the DC bus is maintained for the inverter. In some embodiments, there is a short delay (e.g., about one millisecond) before switching modes so as to avoid false triggers.

For the example embodiment, pseudo code for detecting a failure condition is set forth below.

```
If Input Current (IDe) is Greater Than "THRESHOLD 1" AND
Input Current Rate of Change (dIDe/dt) is Greater than "THRESHOLD
2",
Then
  Load Change is TRUE.
Else
  Load Change is FALSE.
If Voltage Error (Vdc error) is Greater Than "THRESHOLD 3" AND
Current Error (Ide error) is Greater Than "THRESHOLD 4" AND
Load Change is FALSE,
Then
  Rectifier cannot support the DC Bus, switch to Discharge Mode.
Else
  Rectifier is ok, take no action.
```

It is to be understood that only the relevant steps of the methodology are discussed above, but that other software-implemented instructions may be needed to control and manage the overall operation of the UPS.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for detecting a failure of a rectifier in an uninterruptible power supply, comprising:

measuring an input current into the rectifier from a primary power source;

determining, by a controller, a rate of change in the measured current;

determining, by the controller, a current difference between a reference current and the measured current;

measuring voltage output by the rectifier;

determining, by the controller, a voltage difference between a reference voltage and the measured voltage; and detecting, by the controller, a failure condition of the rectifier as a function of the measured input current, the rate of change in the measured current, the current difference, the measured voltage and the voltage difference.

2. The method of claim 1 wherein measuring the input current further comprises determining D phase current in a rotating reference frame and wherein measuring voltage further comprises determining D phase voltage in the rotating reference frame.

3. The method of claim 1 further comprises determining whether the input current is decreasing;

determining whether the rate of change in the measured current is decreasing;

determining whether the current difference is increasing;

determining whether the voltage difference is increasing; and identifying a failure condition of the rectifier when the input current is decreasing and the rate of change in the measured current is decreasing and the current difference is increasing and the voltage difference is increasing.

4. The method of claim 3 further comprises supplying power from a secondary power source to an inverter in response to identifying a failure condition of the rectifier.

5. The method of claim 4 further comprises delaying for a period of time before supplying power from the secondary power source.

6. The method of claim 4 wherein supply power further comprises controlling, by the controller, a DC/DC converter interposed between the inverter and the secondary power supply.

7. The method of claim 1 further comprises filtering at least one of the current difference and the voltage difference prior to detecting a failure condition.

8. A method for detecting a failure of a rectifier in an uninterruptible power supply, comprising:

measuring an input current into the rectifier from a primary power source;

determining, by a controller, a current difference between a reference current and the measured current;

measuring voltage output by the rectifier;

determining, by the controller, a voltage difference between a reference voltage and the measured voltage; and detecting, by the controller, a failure condition of the rectifier when the current difference is increasing and the voltage difference is increasing.

9. The method of claim 8 further comprises determining an absence of a change in load serviced by the rectifier and detecting the failure condition of the rectifier when the current difference is increasing, the voltage difference is increasing and in the absence of a load change.

10. The method of claim 8 wherein measuring the input current further comprises determining D phase current in a rotating reference frame and wherein measuring voltage further comprises determining D phase voltage in the rotating reference frame.

11. The method of claim 8 further comprises supplying power from a secondary power source to an inverter in response to identifying a failure condition of the rectifier.

12. The method of claim 11 further comprises delaying for a period of time before supplying power from the secondary power source.

13. The method of claim 11 wherein supply power further comprises controlling, by the controller, a DC/DC converter interposed between the inverter and the secondary power supply.

14. The method of claim 8 further comprises filtering at least one of the current difference and the voltage difference prior to detecting a failure condition.

* * * * *